(12) United States Patent
Niskanen et al.

(10) Patent No.: US 10,573,511 B2
(45) Date of Patent: Feb. 25, 2020

(54) METHODS FOR FORMING SILICON NITRIDE THIN FILMS

(71) Applicant: ASM IP HOLDING B.V., Almere (NL)

(72) Inventors: Antti Niskanen, Helsinki (FI); Suvi Haukka, Helsinki (FI); Jaakko Anttila, Helsinki (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 13/798,285

(22) Filed: Mar. 13, 2013

(65) Prior Publication Data

US 2014/0273527 A1    Sep. 18, 2014

(51) Int. Cl.
  *H01L 21/02*    (2006.01)
  *C23C 16/455*   (2006.01)
  *C23C 16/34*    (2006.01)

(52) U.S. Cl.
  CPC ........ *H01L 21/0217* (2013.01); *C23C 16/345* (2013.01); *C23C 16/4554* (2013.01); *C23C 16/45553* (2013.01); *H01L 21/0228* (2013.01); *H01L 21/02211* (2013.01); *H01L 21/02274* (2013.01)

(58) Field of Classification Search
  USPC ........................................................ 438/792
  See application file for complete search history.

(56) References Cited

U.S. PATENT DOCUMENTS

| | | | |
|---|---|---|---|
| 6,933,245 B2 | 8/2005 | Lee et al. | |
| 7,625,609 B2 | 12/2009 | Matsuura | |
| 8,080,290 B2 | 12/2011 | Hasebe et al. | |
| 8,119,544 B2 | 2/2012 | Hasebe et al. | |
| 8,563,096 B2 | 10/2013 | Matsunaga et al. | |
| 2007/0048957 A1* | 3/2007 | Lee et al. ...................... | 438/324 |
| 2007/0111545 A1* | 5/2007 | Lee et al. ...................... | 438/787 |
| 2007/0116888 A1 | 5/2007 | Faguet | |
| 2008/0173402 A1* | 7/2008 | Suzuki .................. | C23C 16/511 |
| | | | 156/345.41 |
| 2008/0242116 A1 | 10/2008 | Clark | |
| 2010/0210118 A1* | 8/2010 | Mizuno ......................... | 438/770 |
| 2012/0164848 A1 | 6/2012 | Fujii et al. | |
| 2013/0129940 A1* | 5/2013 | Xiao et al. .................... | 427/578 |
| 2013/0217242 A1* | 8/2013 | Noda et al. ................... | 438/778 |
| 2013/0244446 A1* | 9/2013 | Tsuji ................... | H01L 21/0228 |
| | | | 438/778 |

(Continued)

FOREIGN PATENT DOCUMENTS

| | | | |
|---|---|---|---|
| JP | 2006190770 A | 7/2006 | |
| JP | WO 2012/147680 | * 11/2012 | |

*Primary Examiner* — Abul Kalam

(74) *Attorney, Agent, or Firm* — Seppo Laine Oy

(57) ABSTRACT

The present invention relates to methods of forming silicon nitride thin films on a substrate in a reaction chamber by plasma enhanced atomic layer deposition (PEALD). Exemplary methods include the steps of (i) introducing an octahalotrisilane $Si_3X_8$ silicon precursor, such as octachlorotrisilane (OCTS) $Si_3Cl_8$, into a reaction space containing a substrate, (ii) introducing a nitrogen containing plasma into the reaction space, and wherein steps (i), (ii) and any steps in between constitute one cycle, and repeating said cycles a plurality of times until an atomic layer nitride film having a desired thickness is obtained.

14 Claims, 6 Drawing Sheets

(56) References Cited

U.S. PATENT DOCUMENTS

2014/0023794 A1    1/2014   Mahajani et al.
2014/0051263 A1*   2/2014   Tanaka et al. ................ 438/778
2015/0031218 A1    1/2015   Karakawa

* cited by examiner

METHODS FOR FORMING SILICON NITRIDE THIN FILMS

FIELD OF THE INVENTION

The present application relates generally to atomic layer deposition of silicon nitride thin films.

BACKGROUND OF THE INVENTION

With the scaling down of devices, deposition of dielectric films having good step coverage is desirable. Traditional ALD is a self-limiting process, whereby alternated pulses of reaction precursors saturate a substrate surface and leave no more than one monolayer of material per pulse. The deposition conditions and precursors are selected to ensure self-saturating reactions, such that an adsorbed layer in one pulse leaves a surface termination that is non-reactive with the additional gas phase reactants of the same pulse. A subsequent pulse of different reactants reacts with the previous termination to enable continued deposition. Thus each cycle of alternated pulses leaves no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

As described herein, Atomic Layer Deposition (ALD) processes can be used to deposit silicon nitride. ALD provides good step coverage on three-dimensional structures. One form of ALD in particular, Plasma Enhanced Atomic Layer Deposition (PEALD), is well suited for depositing silicon nitride. A common precursor for PEALD is Hexachlorodisilane (HCDS). However, PEALD using HCDS does not exhibit optimal growth rate at low reaction temperatures. Therefore, there exists a need for a PEALD method with enhanced characteristics, e.g. growth rate, at temperatures lower than those at which HCDS is maximally effective.

SUMMARY OF THE INVENTION

In accordance with an aspect of the present invention, methods for forming silicon nitride thin films on a substrate in a reaction chamber by plasma enhanced atomic layer deposition (PEALD) are provided. According to certain embodiments of the present invention there is provided a method including the steps of (i) introducing an octahalotrisilane $Si_3X_8$ silicon precursor into a reaction space containing a substrate, (ii) introducing a nitrogen and hydrogen containing plasma into the reaction space, and wherein steps (i), (ii) and any steps in between constitute one cycle, and repeating said cycles a plurality of times until a silicon nitride film having a desired thickness is obtained.

According to certain embodiments, the methods include a silicon nitride deposition cycle comprising: providing a vapor phase first reactant pulse comprising a silicon, e.g. octachlorotrisilane (OCTS), precursor into the reaction chamber to form no more than about a single molecular layer of the silicon precursor on the substrate, removing excess silicon precursor and any reaction byproducts from the reaction chamber, providing a vapor phase second reactant pulse comprising nitrogen and hydrogen-containing plasma, such that the nitrogen and hydrogen-containing plasma converts the adsorbed silicon precursor to a silicon nitride film.

According to certain embodiments, nitrogen and hydrogen flows continuously to the reaction chamber during the deposition process. Providing the vapor phase second reactant pulse comprises generating a plasma in the flowing nitrogen and hydrogen. The nitrogen and hydrogen-containing plasma may be generated remotely or in the reaction chamber itself.

Furthermore, according to certain embodiments the silicon reactant and the nitrogen and hydrogen-containing plasma are provided simultaneously or in partly overlapping pulses.

Additionally, according to certain embodiments the silicon precursor and the nitrogen and hydrogen-containing plasma are provided alternately and sequentially. The deposition cycle is repeated until a thin film of a desired thickness and composition is obtained. An example of a silicon precursor which can be utilized with the present methods is octahalotrisilane $Si_3X_8$, wherein X is halide Cl, F, and Br, preferably octachlorotrisilane $Si_3Cl_8$.

For purposes of summarizing embodiments of the invention and some of the advantages achieved over the prior art, certain objects and advantages have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIG. 4 shows the related non-uniformity with regards to thickness and refractive index.

FIG. 5 shows the related non-uniformity with regards to thickness and refractive index.

FIG. 6 shows the related non-uniformity with regards to thickness and refractive index.

FIG. 7 shows the related non-uniformity with regards to thickness and refractive index.

FIG. 8 shows the related non-uniformity with regards to thickness and refractive index.

FIG. 9 shows the related non-uniformity with regards to thickness and refractive index.

DETAILED DESCRIPTION OF EXEMPLARY EMBODIMENTS

Figure 1:
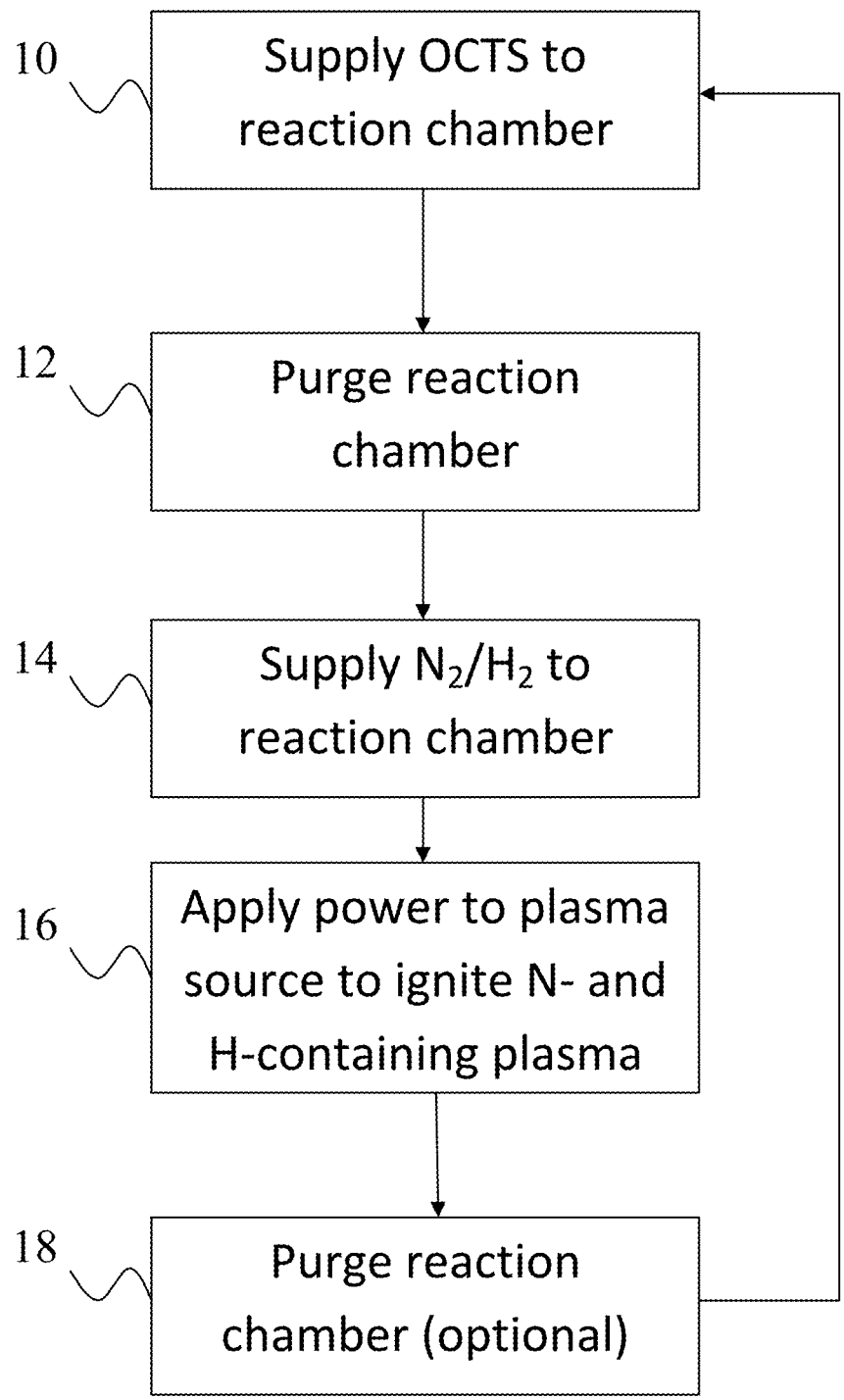
FIG. 1 shows the outline of an OCTS PEALD process including a OCTS purge step.

Silicon nitride has a wide variety of applications, as will be apparent to the skilled artisan. Silicon nitride thin films can be deposited on a substrate by plasma-enhanced atomic layer deposition (PEALD)-type processes. The thickness and composition of each of the layers can be controlled to produce a $SiN_x$ film with the desired characteristics.

ALD type processes are based on controlled, self-limiting surface reactions of precursor chemicals. Gas phase reactions are avoided by contacting the substrate alternately and sequentially with the precursors. Vapor phase reactants are separated from each other in the reaction chamber, for example, by removing excess reactants and/or reactant byproducts from the reaction chamber between reactant pulses.

The methods presented herein allow deposition of silicon nitride films on substrate surfaces. Geometrically challenging applications are also possible due to the nature of the ALD-type processes. According to some embodiments, atomic layer deposition (ALD) type processes are used to form silicon nitride films on substrates, such as integrated circuit work pieces.

For example, a substrate or work piece is placed in a reaction chamber and subjected to alternately repeated surface reactions. In particular, thin films are formed by repetition of a self-limiting ALD cycle. Preferably, each ALD cycle comprises at least three distinct phases. One reactant will form no more than about one monolayer on the substrate surface and includes silicon. This reactant, also referred to herein as "the silicon reactant" or "silicon precursor" may be, for example, $Si_3Cl_8$. A second reactant comprising reactive nitrogen and hydrogen species, typically nitrogen and hydrogen containing plasma, converts the adsorbed silicon precursor compound to the silicon nitride. One or more of the reactants may be provided with the aid of a carrier gas, such as Ar or He. In certain embodiments the silicon reactant and the nitrogen and hydrogen reactant are provided with the aid of a carrier gas.

In certain embodiments the substrate on which deposition is desired, for example a semiconductor work piece, is loaded into a reactor. The reactor may be part of a cluster tool in which a variety of different processes in the formation of an integrated circuit are carried out. For example, a flow-type reactor can be utilized. Additionally, for example, a high-volume manufacturing capable single wafer ALD reactor or a batch reactor comprising multiple substrates can be used. When implementing the present methods utilizing batch ALD reactors, the number of substrates can be within the range of, for example, 10 to 200, 50 to 150, 100 to 130 or other such range therein.

In certain embodiments, the substrate can be a FinFET structure in which a silicon nitride film is deposited over a Fin or Fins by ALD.

Exemplary single wafer reactors, designed specifically to enhance ALD processes, are commercially available from ASM America, Inc. (Phoenix, Ariz.) under the tradenames Pulsar® 2000 and Pulsar® 3000 and ASM Japan K.K (Tokyo, Japan) under the tradename Eagle® XP and XP8. Exemplary batch ALD reactors, designed specifically to enhance ALD processes, are commercially available from and ASM Europe B.V (Almere, Netherlands) under the tradenames A4ALD™ and A412™.

In certain embodiments, if desired, the exposed surfaces of the work piece can be terminated to react with the first phase of the ALD process. In some embodiments a separate termination step is not required.

Figure 2:
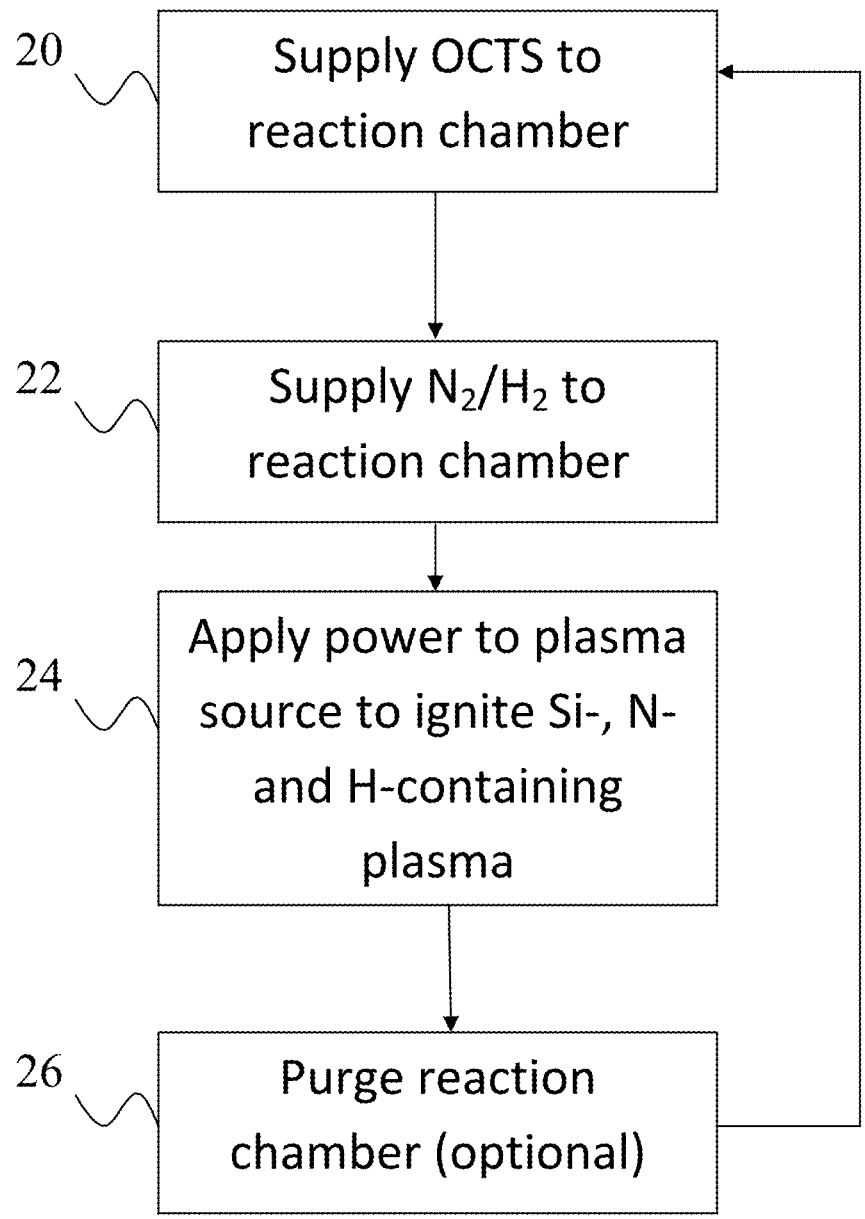
FIG. 2 shows the outline of an OCTS PEALD process for partially or totally overlapping pulses.

As shown in FIGS. 1 and 2, one or more deposition cycles can begin with provision of the silicon precursor 10 and 20, followed by the reactive nitrogen and hydrogen species 14 and 22. However, one or more deposition cycles may begin with provision of the reactive nitrogen and hydrogen species followed by the silicon precursor.

In a typical implementation the reaction chamber is purged between reaction pulses 18 and 26. In certain embodiments, as seen in FIG. 2, nitrogen and hydrogen are provided to the reaction chamber continuously during each deposition cycle, or during the entire ALD process, and reactive nitrogen and hydrogen species are provided by generating a plasma in the nitrogen and hydrogen 24, either in the reaction chamber or upstream of the reaction chamber. The flowing nitrogen and hydrogen may also serve as a purge gas for the first and/or second reactant, as well as reactive nitrogen and hydrogen species. The cycle is repeated until a film of the desired thickness is obtained.

The plasma pulse contains hydrogen and nitrogen containing plasma. Furthermore, reactive nitrogen and hydrogen species can be generated from $NH_3$ by generating plasma, 16. Reactive nitrogen and hydrogen species can also be generated from $N_2$ and $H_2$ containing gas by generating plasma in step 16. In certain embodiments, nitrogen and/or hydrogen plasma can be provided in a deposition cycle, or in the deposition process.

At the beginning of the ALD process the silicon precursor can be provided first. After the initial surface termination, if desired, a first silicon reactant pulse can be supplied to the work piece. In accordance with some embodiments, the first reactant pulse comprises a carrier gas flow and a volatile silicon species, such as $Si_3Cl_8$, which is reactive with the surfaces of interest of the work piece. Accordingly, the silicon reactant adsorbs upon the work piece surfaces. The first reactant pulse self-saturates the work piece's surfaces such that any excess constituents of the first reactant pulse do not further react with the molecular layer formed by this process.

The first silicon reactant pulse is preferably supplied in gaseous form. The silicon reactant gas is considered "volatile" for purposes of the present description if the species exhibits sufficient vapor pressure under the process conditions to transport the species to the work piece in sufficient concentration to saturate exposed surfaces.

For example, the silicon reactant pulse can be from approximately 0.05 to 5.0 seconds, or for example 0.1 to 3 s or about 0.2 to about 1.0 s.

In some examples the silicon precursor does not decompose on the surface and the adsorbing step is self-limiting. In certain examples less than about 50%, for example less than about 30%, less than about 20%, less than about 10% or less than about 5% of the silicon precursor decomposes on the substrate surface. Silicon precursor decomposition can be observed from the increased growth rate.

An example of a silicon precursor which can be utilized with the present methods is octahalotrisilane $Si_3X_8$, wherein X is halide Cl, F and Br. A particularly well suitable silicon precursor is octachlorotrisilane $Si_3Cl_8$ (OCTS).

Previous methods using PEALD for depositing $SiN_x$ use HCDS and operate at relatively high temperatures, e.g. the lowest possible temperatures being over 100° C. When the reaction temperature of the process is lowered, typically resulting in a more stable and cost effective process, the growth rate of $SiN_x$ decreases when utilizing HCDS. Furthermore, in certain situations the high temperatures at which HCDS induced $SiN_x$ growth is optimal are not suited for the substrate itself and therefore require lower reaction temperatures.

Octahalotrisilane, such as octachlorotrisilane, pulsed at, for example, 20-400° C. produces superior growth rate compared to that of HCDS at similar reaction temperatures. However, much above these temperatures, for example in the range at which HCDS produces optimal growth rates, Octahalotrisilane begins to decompose and therefore becomes a less attractive supplement to HCDS.

While it is possible to deposit silicon nitride films using HCDS and nitrogen-containing plasma at very low temperatures, below 100° C., the growth rate is very slow compared when using OCTS. However, according to certain embodiments it might be desirable to use HCDS at reaction temperatures below 100° C., preferably below 50° C. and more preferably below 25° C. if a slow growth rate is not an obstacle for the desired manufacturing according to a certain specific application.

After sufficient time for a molecular layer to adsorb on the substrate surface, excess first reactant can then be removed (purged) from the reaction space, 12. In certain embodiments the flow of the first chemistry is stopped while continuing to flow a carrier gas or purge gas for a sufficient time to diffuse or purge excess reactants and reactant by-products, if any, from the reaction space. The excess first reactant can be purged with the aid of nitrogen and hydrogen gas which is flowing throughout the ALD cycle. For example, the first reactant can be purged for approximately 0.1 to about 10 s, or for example for about 0.3 to about 5 s or about 0.3 to about 1 s.

In the second phase, nitrogen and hydrogen-containing plasma is provided to the work piece. Nitrogen and hydrogen, $N_2/H_2$, is provided continuously to the reaction chamber during each ALD cycle in some embodiments. Nitrogen and hydrogen-containing plasma may be formed by generating a plasma in nitrogen and hydrogen in the reaction chamber or upstream of the reaction chamber, for example by flowing the nitrogen and hydrogen through a remote plasma generator.

Typically, the nitrogen and hydrogen-containing plasma is provided for approximately 0.1 to about 10 seconds. In some examples nitrogen and hydrogen-containing plasma can be provided for about 0.1 to about 10 s, 0.5 to about 5 s or 0.5 to about 2.0 s. However, depending on the reactor type, substrate type and its surface area, the nitrogen and hydrogen-containing plasma pulsing time may be even greater than 10 seconds. For example, pulsing times can even be on the order of minutes. The optimum pulsing time can be determined based on the particular circumstances.

Nitrogen and hydrogen plasma may be generated by applying RF power of, for example, about 50 to 1000 W, 100-600 W or 100-300 W. The RF power may be applied to nitrogen and hydrogen that flows during the nitrogen and hydrogen plasma pulse time, which flows continuously through the reaction chamber, or which flows through a remote plasma generator. Thus in certain embodiments the plasma is generated in situ, while in others the plasma is generated remotely.

After a time period sufficient to completely saturate and react the molecular layer with the nitrogen and hydrogen plasma pulse, any excess reactant and reaction byproducts are removed from the reaction space. As with the removal of the first reactant, this step may comprise stopping the generation of radicals and continuing to flow the nitrogen and hydrogen for a time period sufficient for excess reactive species and volatile reaction by-products to diffuse out of and be purged from the reaction space. The purge may, in some examples, be from about 0.1 to about 10 s, about 0.1 to about 4 s or about 0.1 to about 0.5 s. Together, the nitrogen and hydrogen plasma provision and removal represent a second phase in the illustrated process, and can also be considered the nitridation phase.

The two phases together represent one ALD cycle, which is repeated to form silicon nitride thin films of the desired thickness. While the ALD cycle is generally referred to herein as beginning with the silicon phase, it is contemplated that in other embodiments the cycle may begin with the nitridation phase. One of skill in the art will recognize that the first reactant phase generally reacts with the termination left by the last phase in the previous cycle. Thus, while no reactant may be previously adsorbed on the substrate surface or present in the reaction space if the nitridation phase is the first phase in the first ALD cycle, in subsequent cycles the oxidation phase will effectively follow the silicon phase.

In certain embodiments, a silicon phase comprises providing a pulse of $Si_3Cl_8$. Excess $Si_3Cl_8$ is removed and reaction by-products, if any, are removed. The substrate is then contacted with nitrogen and hydrogen plasma to form a silicon nitride. The nitrogen and hydrogen plasma may be generated in situ, for example in a nitrogen and hydrogen gas that flows continuously throughout the ALD cycle.

As mentioned above, each pulse or phase of each ALD cycle is preferably self-limiting. An excess of reactants is supplied in each phase to saturate the susceptible structure surfaces. Surface saturation ensures reactant occupation of all available reactive sites (subject, for example, to physical size or "steric hindrance" restraints) and thus ensures excellent step coverage. In some embodiments the pulse time of one or more of the reactants can be reduced such that complete saturation is not achieved and less than a monolayer is adsorbed on the substrate surface. However, in some embodiments the silicon precursor step is not self-limiting, for example, due to decomposition or gas phase reactions.

As discussed above, in some embodiments, an ALD process begins with the silicon phase, followed by the nitridation phase. However, in other embodiments the nitridation phase is first, followed by the silicon phase. For example, the substrate may first be contacted with a pulse of a reactive nitrogen and hydrogen species, such as nitrogen and hydrogen and hydrogen containing plasma. Plasma is shut off and excess nitrogen and hydrogen and hydrogen is removed. The nitrogen and hydrogen plasma may be generated in situ, for example in an nitrogen and hydrogen gas that flows continuously throughout the ALD cycle.

In some embodiments, the silicon reactant and the reactive nitrogen and hydrogen species are both provided prior to any purge step. Thus, in some embodiments a pulse of silicon precursor is provided, a pulse of reactive nitrogen and hydrogen species precursor is provided, and any unreacted silicon and reactive nitrogen and hydrogen precursor is purged from the reaction space. The silicon precursor and reactive nitrogen and hydrogen species may be provided sequentially or together. In some embodiments, the silicon precursor and reactive nitrogen and hydrogen species are provided simultaneously. The ratio of the nitrogen and hydrogen may be selected to obtain a desired Si:N ratio in the deposited thin film having stoichiometry $SiN_x$. where x varies from about 0.5 to about 2.0, as long as some Si—N bonds are formed. In some cases, x preferably varies from about 0.9 to about 1.7, more preferably from about 1.0 to about 1.5, and most preferably from about 1.2 to about 1.4. Generally silicon nitride where Si has an oxidation state of +IV is formed and the amount of nitride in the material might vary.

After removal of unreacted silicon, nitrogen and hydrogen radicals may be generated in flowing nitrogen and hydrogen gas. Again, nitrogen and hydrogen gas may be flowing continuously during the ALD cycle. The nitrogen and hydrogen radicals react with adsorbed silicon precursor, forming a layer of silicon nitride.

In some embodiments the growth rate of the deposited film is below 2 Å/cycle, preferably from about 0.5 Å/cycle to about 1.5 Å/cycle. In certain embodiments the growth rate is below 0.5 Å/cycle.

The following are example conditions and parameters for processes according to embodiments of the present invention described above. The silicon precursor is selected from the group consisting of; $Si_3Cl_8$, $Si_3F_8$ and $Si_3Br_8$. For example, OCTS. The reactive nitrogen species are selected from the group consisting of; Nitrogen and hydrogen containing plasma, nitrogen and hydrogen atoms or radicals and N/H-species containing plasma. For example, N/H-containing plasma made from, for example, $N_2/H_2$ or $NH_3$. Examples of carrier gasses are Ar, He and $N_2$.

The silicon precursor is pulsed in to the reaction chamber at precursor temperatures (i.e. temperature in the precursor source vessel) between 20-100° C., for example at a temperature between 30-80° C., 40-70° C. or 50-60° C. Examples of overall reaction temperatures i.e. reaction chamber temperature range from 40-400° C., for example at a temperature between 50-350° C., 75-300° C. or 100-250° C. In some embodiments the reaction temperature is below 250° C. and preferably below 150° C. and more preferably below 125° C. and in some cases below 100° C.

The pressure in the reaction chamber during the plasma step is maintained between 0.5-20 torr, preferably between 1-10 torr and more preferably between 2-6 torr.

The silicon precursor is pulsed for between 0.05-10 s, for example, for a length of time between 0.1-5 s or 0.1-2 s. The nitrogen containing plasma is pulsed for between 0.05-10 s, for example, for a length of time between 0.1-5 s or 0.1-2 s. In certain embodiments, the pulses of the silicon precursor and nitrogen containing plasma may be at least partially overlapping or even simultaneous. However, the length of silicon purge can be between 0.5-10 s, for example, for a length of time between 0.5-3 s or 0.5-2 s. Similarly, the length of the nitrogen plasma purge can be between 0.5-10 s, for example, for a length of time between 0.5-3 or 0.5-2 s.

Examples of the range of plasma power extend between, and include, for example, 50-1500 W. For example, at a power selected between 50-1000 W, 100-800 W or 100-500 W.

The conditions and parameters listed above are examples and example ranges to better illustrate the present invention. Those of ordinary skill in the art, in combination with the disclosure above, will recognize variations in the expressed limits which result in a process which would not depart from the scope of the present invention.

The following is an example of silicon nitride deposition by PEALD using OCTS

Silicon nitride films were deposited using OCTS and $N_2/H_2$-plasma in a PEALD showerhead reactor using direct plasma. An OCTS source bottle was held at a temperature of about 50° C. Total flow of argon to the reaction chamber was 1200 sccm. $N_2/H_2$ flows and flow ratios was varied from about 90:10 to about 25:75 (sccm of $N_2:H_2$), in some experiments being 100:50, 50:50 or 100:100. The reaction chamber was held at temperatures from about 100 to about 120° C. OCTS pulse length was varied from about 0.2 s to about 2.0 s. OCTS purge length was varied from about 0.5 s to about 8.0 s. $N_2/H_2$-plasma pulse length was varied from about 0.5 s (i.e. no purge) to about 10.0 s. $N_2/H_2$-plasma purge length was varied from about zero (i.e. no purge) to about 4.0 s. Plasma power was varied from about 50 W to about 1000 W. Pressure of the reaction chamber was held from about 2 torr to about 4 torr. Total cycles deposited varied from about 250 cycles to about 2000 cycles.

Depending on the process parameters applied, growth rate of silicon nitride varied from about 0.44 to about 1.46 Å/cycle, thickness non-uniformity varied from about 0.7% to about 20%, refractive index varied from about 1.56 to about 1.88.

Growth rate and thickness non-uniformity increased when $N_2$ flow was increased from about 50 sccm to about 100 sccm and also when plasma pulse length was increased from about 4.0 s to about 6.0 s. When plasma power was increased from 50 W to 350 W the growth rate and refractive index increased and the thickness and refractive index non-uniformities decreased. When reaction chamber pressure was increased from about 2.0 torr to about 4.0 torr the growth rate increased and thickness non-uniformity and refractive index non-uniformity decreased and refractive index varied between the range from about 1.79 to about 1.84.

FIGS. 3-9 show various examples and benefits of OCTS PEALD. Particularly, the figures show the growth rates and non-uniformity of various examples plotted against different parameters.

Figure 3:
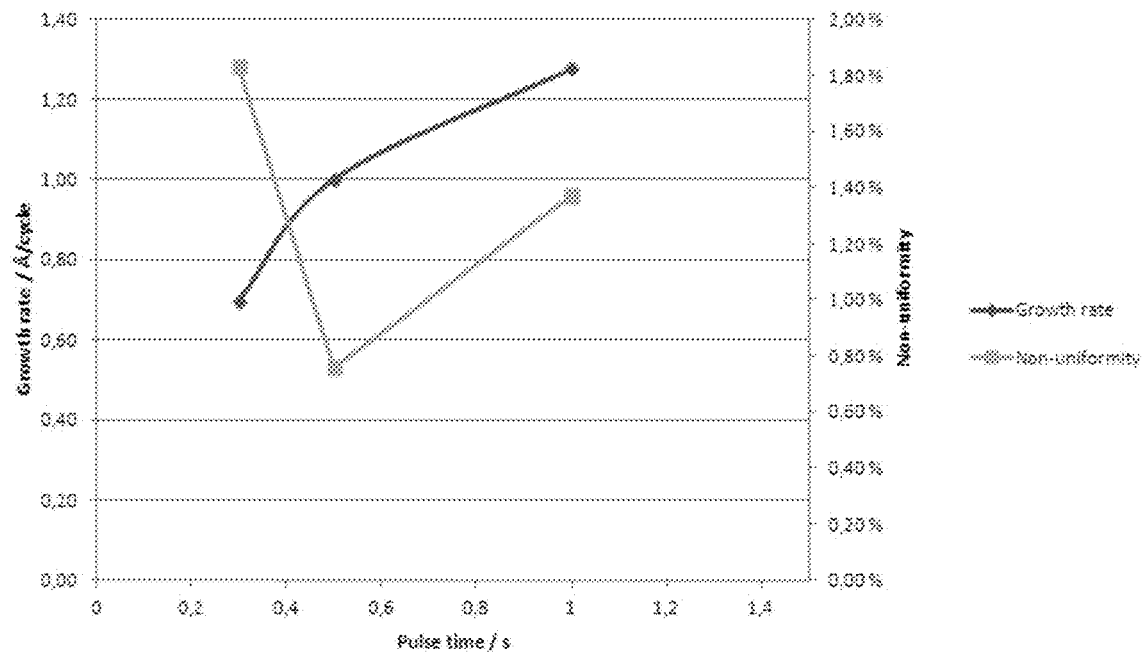
FIG. 3 shows the growth rate and related thickness non-uniformity of an OCTS-PEALD process plotted against the silicon precursor pulse time.
Figure 4:
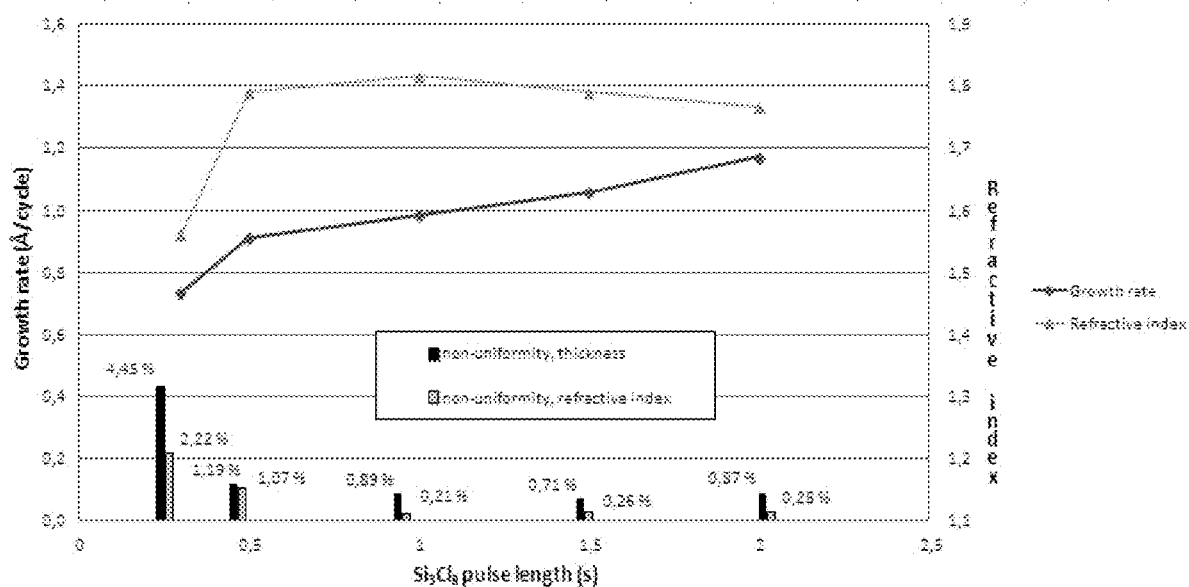
FIG. 4 shows the refraction index and growth rate plotted against pulse time for examples from table 1. Additionally.

FIG. 3 shows the growth rate and related thickness non-uniformity of an OCTS-PEALD process plotted against the silicon precursor pulse time. The process was run three times having 500 cycles each. A similar process was run five times having 300 cycles each, the results of which are shown in FIG. 4. The results of the runs are presented in Table 1. The parameters of the example are presented in Table 2.

TABLE 1

|  | Thickness/nm | Thickness N.U. (1-σ) | R.I. | R.I.N.U (1-σ) | Growth rate/ Å/cycle |
| --- | --- | --- | --- | --- | --- |
| 300 w/ 0.3 s | 22.04 | 4.45% | 1.56 | 2.22% | 0.73 |
| 300 w/ 0.5 s | 27.17 | 1.19% | 1.79 | 1.07% | 0.91 |
| 300 w/ 1 s | 29.50 | 0.89% | 1.82 | 0.21% | 0.98 |
| 300 w/ 1.5 s | 31.73 | 0.71% | 1.79 | 0.26% | 1.06 |
| 300 w/ 2 s | 35.14 | 0.87% | 1.77 | 0.28% | 1.17 |
| 500 w/ 0.3 s | 34.88 | 1.83% | 1.80 | 0.18% | 0.70 |
| 500 w/ 0.5 s | 50.03 | 0.76% | 1.74 | 0.18% | 1.00 |
| 500 w/ 1 s | 63.85 | 1.37% | 1.81 | 0.30% | 1.28 |

TABLE 2

| Parameter | Value |
| --- | --- |
| Si-precursor purge time | 8 s |
| N-plasma pulse time | 6 s |
| N-plasma purge time | — |

TABLE 2-continued

| Parameter | Value |
| --- | --- |
| Plasma power | 350 W |
| N₂ flow | 50 sccm |
| H₂ flow | 50 sccm |
| Si-precursor temperature | 50° C. |
| Reaction temperature | 120° C. |

FIG. 4 shows the refraction index and growth rate plotted against pulse time for the five examples in Table 1 above having 300 cycles each. Additionally, FIG. 4 shows the related non-uniformity with regards to thickness and refractive index.

Figure 5:
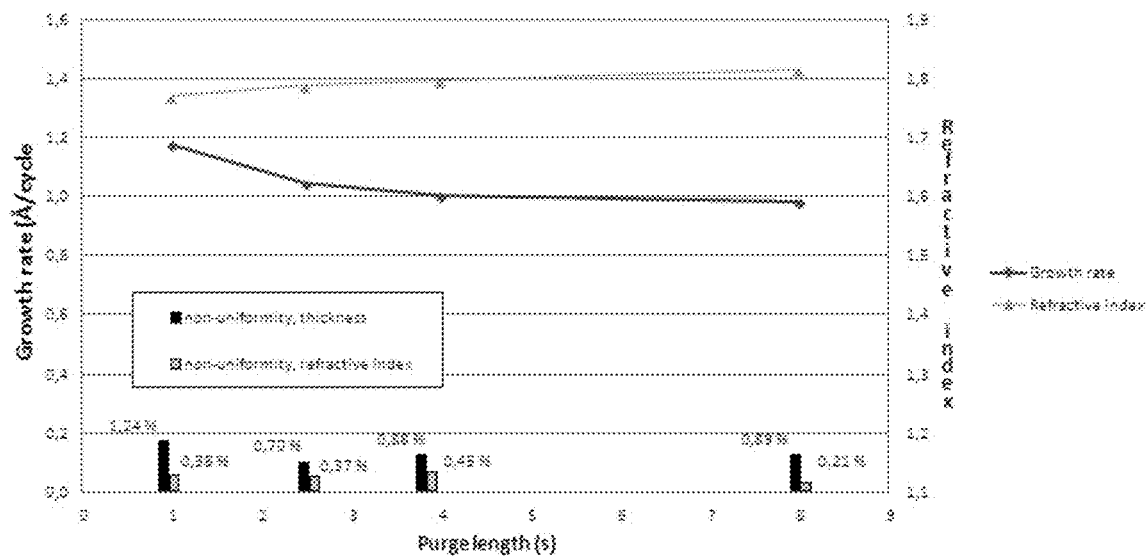
FIG. 5 shows the growth rate and refractive index of an OCTS-PEALD process plotted against purge time. Additionally.

FIG. 5 shows the growth rate and refractive index of an OCTS-PEALD process plotted against purge time. Additionally, FIG. 5 shows the related non-uniformity with regards to thickness and refractive index. The process was run four times with the purge time varying from 1 to 8 seconds. The results of the runs are presented in Table 3. The parameters of the example are presented in Table 4.

TABLE 3

| | Thickness/nm | Thickness N.U. (1-σ) | R.I. | R.I.N.U (1-σ) | Growth rate/ Å/cycle |
| --- | --- | --- | --- | --- | --- |
| 1 s | 35.26 | 1.24% | 1.77 | 0.38% | 1.18 |
| 2.5 s | 31.35 | 0.70% | 1.79 | 0.37% | 1.04 |
| 4 s | 30.12 | 0.88% | 1.80 | 0.45% | 1.00 |
| 8 s | 29.50 | 0.89% | 1.82 | 0.21% | 0.98 |

TABLE 4

| Parameter | Value |
| --- | --- |
| Si-Precursor pulse time | 1 s |
| N-plasma pulse time | 6 s |
| N-plasma purge time | — |
| Plasma power | 350 W |
| N₂ flow | 50 sccm |
| H₂ flow | 50 sccm |
| Number of cycles | 300 |
| Si-precursor temperature | 50° C. |
| Reaction temperature | 120° C. |

Figure 6:
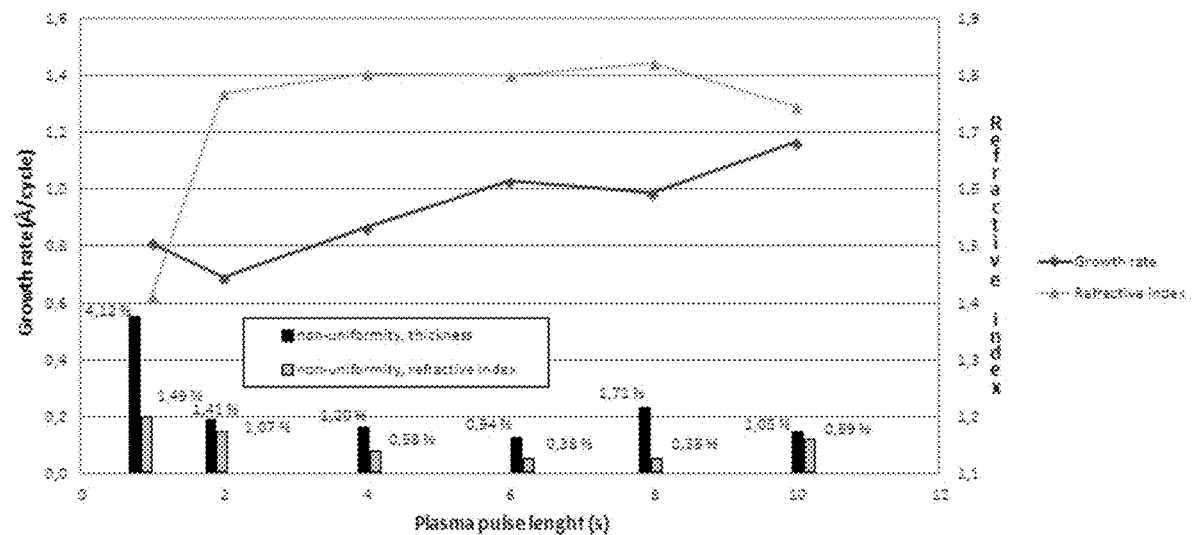
FIG. 6 shows the growth rate and refractive index of an OCTS-PEALD process plotted against plasma duration. Additionally.

FIG. 6 shows the growth rate and refractive index of an OCTS-PEALD process plotted against plasma duration. Additionally, FIG. 6 shows the related non-uniformity with regards to thickness and refractive index. The process was run six times with the plasma pulse durations varying from 1 to 10 seconds. The results of the runs are presented in Table 5. The parameters of the example are presented in Table 6.

TABLE 5

| | Thickness/nm | Thickness N.U. (1-σ) | R.I. | R.I.N.U (1-σ) | Growth rate/ Å/cycle |
| --- | --- | --- | --- | --- | --- |
| 1 s | 24.36 | 4.12% | 1.41 | 1.49% | 0.81 |
| 2 s | 20.67 | 1.41% | 1.77 | 1.07% | 0.69 |
| 4 s | 25.97 | 1.20% | 1.80 | 0.58% | 0.87 |
| 6 s | 30.87 | 0.94% | 1.80 | 0.38% | 1.03 |
| 8 s | 29.71 | 1.71% | 1.82 | 0.38% | 0.99 |
| 10 s | 35.07 | 1.08% | 1.74 | 0.89% | 1.17 |

TABLE 6

| Parameter | Value |
| --- | --- |
| Si-Precursor pulse time | 1 s |
| Si-Precursor purge time | 4 s |
| N-plasma purge time | — |
| Plasma power | 350 W |
| N₂ flow | 50 sccm |
| H₂ flow | 50 sccm |
| Number of cycles | 300 |
| Si-precursor temperature | 50° C. |
| Reaction temperature | 120° C. |

Figure 7:
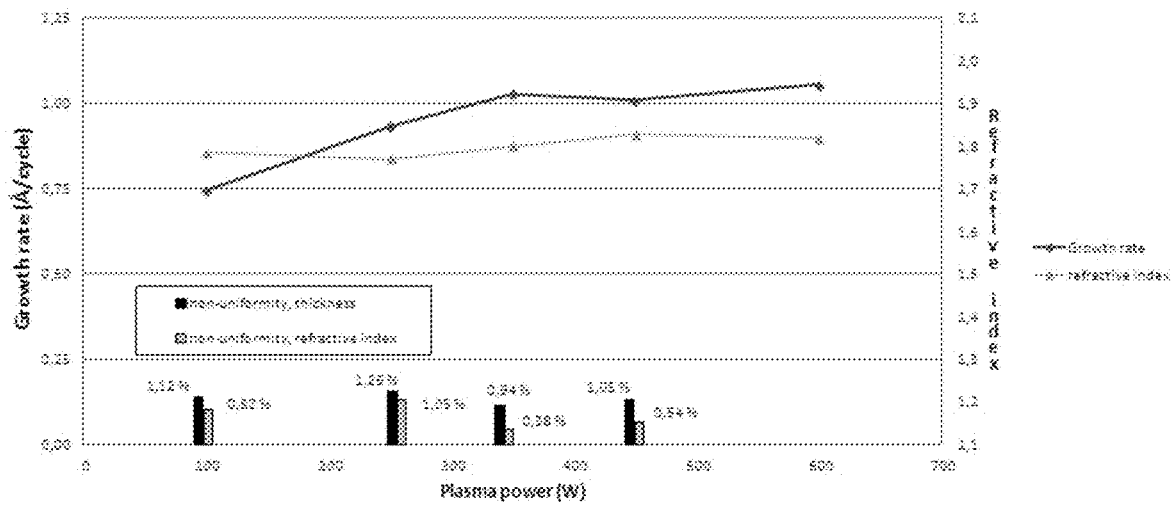
FIG. 7 shows the growth rate and refractive index of an OCTS-PEALD process plotted against plasma power. Additionally.

FIG. 7 shows the growth rate and refractive index of an OCTS-PEALD process plotted against plasma power. Additionally, FIG. 7 shows the related non-uniformity with regards to thickness and refractive index. The process was run five times with the plasma power varying from 100 to 600 W. The results of the runs are presented in Table 7. The parameters of the example are presented in Table 8.

TABLE 7

| | Thickness/nm | Thickness N.U. (1-σ) | R.I. | R.I.N.U (1-σ) | Growth rate/ Å/cycle |
| --- | --- | --- | --- | --- | --- |
| 100 W | 22.37 | 1.12% | 1.78 | 0.82% | 0.75 |
| 250 W | 28.02 | 1.26% | 1.77 | 1.05% | 0.93 |
| 350 W | 30.87 | 0.94% | 1.80 | 0.38% | 1.03 |
| 450 W | 30.28 | 1.05% | 1.83 | 0.54% | 1.01 |
| 600 W | 31.71 | n/a | 1.82 | n/a | 1.06 |

TABLE 8

| Parameter | Value |
| --- | --- |
| Si-Precursor pulse time | 1 s |
| Si-Precursor purge time | 4 s |
| N-plasma pulse time | 6 s |
| N-plasma purge time | — |
| N₂ flow | 50 sccm |
| H₂ flow | 50 sccm |
| Number of cycles | 300 |
| Si-precursor temperature | 50° C. |
| Reaction temperature | 120° C. |

Figure 8:
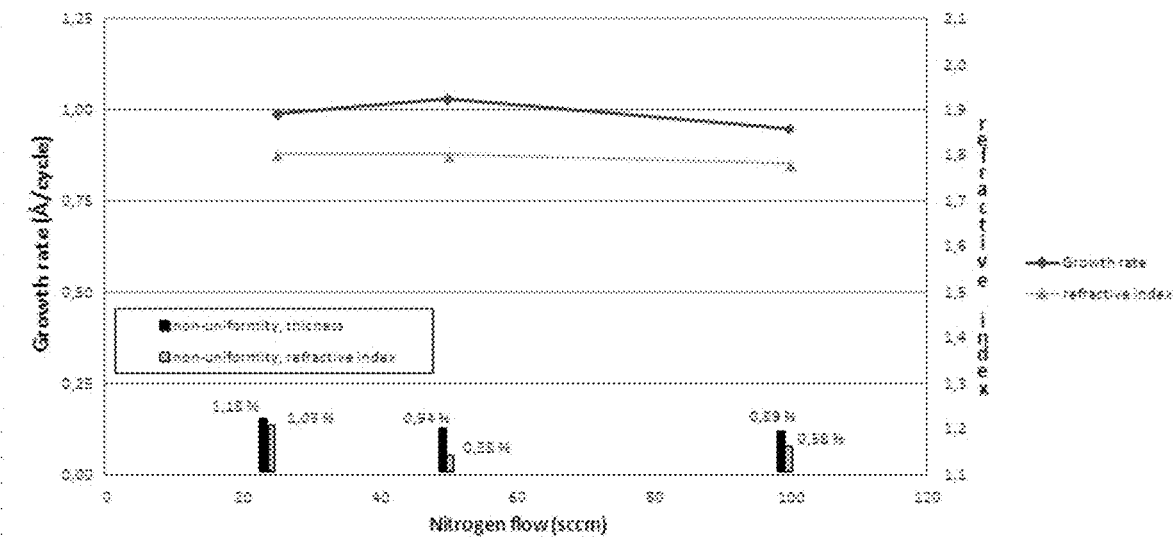
FIG. 8 shows the growth rate and related thickness non-uniformity of an OCTS-PEALD process plotted against nitrogen flow. Additionally.

FIG. 8 shows the growth rate and related thickness non-uniformity of an OCTS-PEALD process plotted against nitrogen flow. Additionally, FIG. 8 shows the related non-uniformity with regards to thickness and refractive index. The process was run three times with the nitrogen flow varying from 100 sccm to 25 sccm and the hydrogen flow unchanging at 50 sccm. The results of the runs are presented in Table 9. The parameters of the example are presented in Table 10.

TABLE 9

| | Thickness/nm | Thickness N.U. (1-σ) | R.I. | R.I.N.U (1-σ) | Growth rate/ Å/cycle |
| --- | --- | --- | --- | --- | --- |
| 100 sccm | 28.49 | 0.89% | 1.78 | 0.58% | 0.95 |
| 50 sccm | 30.87 | 0.94% | 1.80 | 0.38% | 1.03 |
| 25 sccm | 29.68 | 1.18% | 1.80 | 1.03% | 0.99 |

TABLE 10

| Parameter | Value |
| --- | --- |
| Si-Precursor pulse time | 1 s |
| Si-Precursor purge time | 4 s |
| N-plasma pulse time | 6 s |
| N-plasma purge time | — |
| Plasma power | 350 W |
| Number of cycles | 300 |
| Si-precursor temperature | 50° C. |
| Reaction temperature | 120° C. |

Figure 9:
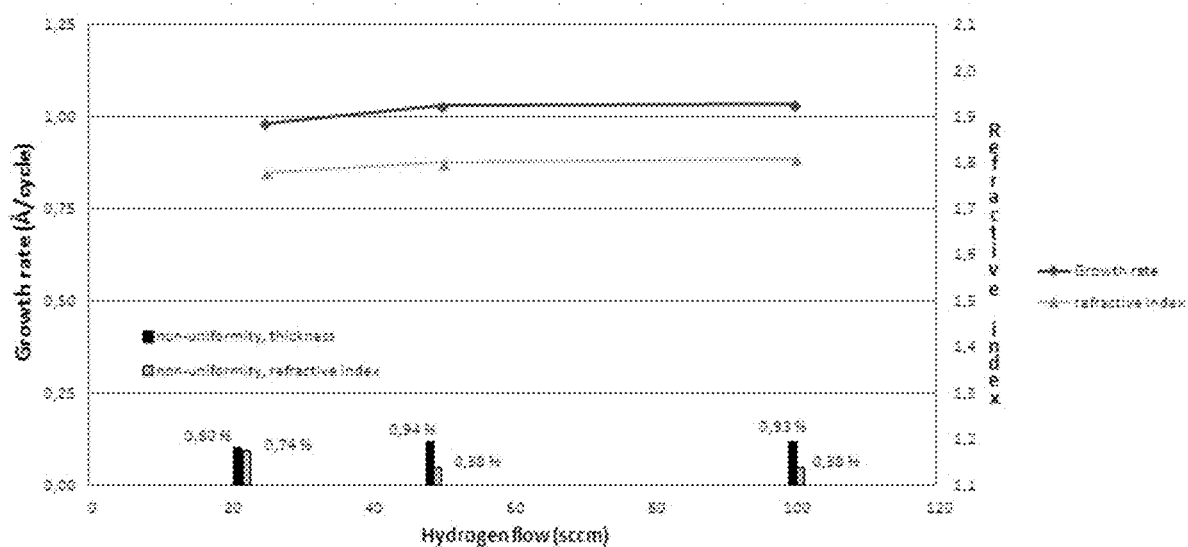
FIG. 9 shows the growth rate and related thickness non-uniformity of an OCTS-PEALD process plotted against hydrogen flow. Additionally.

FIG. 9 shows the growth rate and related thickness non-uniformity of an OCTS-PEALD process plotted against hydrogen flow. Additionally, FIG. 9 shows the related non-uniformity with regards to thickness and refractive index. The process was run three times with the hydrogen flow varying from 100 sccm to 25 sccm and the nitrogen flow unchanging at 50 sccm. The results of the runs are presented in Table 11. The parameters of the example are the same as presented in Table 10 above.

TABLE 11

|  | Thickness/nm | Thickness N.U. (1-σ) | R.I. | R.I.N.U (1-σ) | Growth rate/ Å/cycle |
| --- | --- | --- | --- | --- | --- |
| 100 sccm | 31.03 | 0.93% | 1.81 | 0.38% | 1.03 |
| 50 sccm | 30.87 | 0.94% | 1.80 | 0.38% | 1.03 |
| 25 sccm | 29.46 | 0.80% | 1.78 | 0.74% | 0.98 |

All of the examples from Tables 1-11 were conducted in a reaction chamber having a top pressure of 4 torr and a bottom pressure of 2 torr.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. A method of forming a silicon nitride film by plasma enhanced atomic layer deposition (PEALD) comprising the steps of;
   i. introducing an octahalotrisilane $Si_3X_8$ silicon precursor into a reaction space containing a substrate,
   ii. introducing a nitrogen containing plasma into the reaction space,
   iii. wherein steps (i), (ii) and any steps in between constitute one cycle, and repeating said cycles a plurality of times until a film comprising silicon nitride having a desired thickness is obtained, and
  wherein the reaction space is kept at a temperature below 150° C., and the method is done in the absence of a catalyst.

2. The method in accordance with claim 1, wherein the X of said octahalotrisilane $Si_3X_8$ is a halide selected from the group of F and Br.

3. The method in accordance with claim 1, wherein the octahalotrisilane $Si_3X_8$ silicon precursor is octachlorotrisilane (OCTS).

4. The method in accordance with claim 1, further comprising keeping the reaction space pressure between 1-10 torr while introducing the nitrogen containing plasma into the reaction space.

5. The method in accordance with claim 1, wherein the nitrogen containing plasma also contains hydrogen and is formed by either $N_2/H_2$ or $NH_3$.

6. The method in accordance with claim 2, wherein step (i) is self limiting.

7. The method in accordance with claim 2, further comprising a purge step between steps (i) and (ii) for removing excess silicon precursor and any reaction byproducts from the reaction space.

8. The method in accordance with claim 2, further comprising a first purge step between steps (i) and (ii) and a second purge step after step (ii), wherein each of said purge steps are for removing excess silicon precursor gases formed in plasma discharge as well as any reaction byproducts from the reaction space.

9. The method in accordance with claim 7, wherein each iteration of step (i) produces less than 2 molecular layers of the silicon precursor.

10. The method in accordance with claim 7, wherein each iteration of step (i) produces less than about 1 molecular layer of the silicon precursor.

11. The method in accordance with claim 2, wherein the silicon precursor is introduced in its vapor stage.

12. A method of forming a silicon nitride film by plasma enhanced atomic layer deposition (PEALD) consisting of the steps:
    i. introducing an octahalotrisilane $Si_3X_8$ silicon precursor into a reaction space containing a substrate,
    ii. introducing a plasma comprising nitrogen within the reaction space, and
    iii. purging the reaction space to remove the octahalotrisilane and/or nitrogen-containing plasma,
    iv. wherein steps (i), (ii), and (iii) a constitute one cycle, and wherein the process comprises repeating said cycles a plurality of times until a film comprising silicon nitride having a desired thickness is obtained, and
    v. wherein the octahalotrisilane is introduced at a temperature below 100° C., and no catalyst is introduced into the reaction space.

13. The method in accordance with claim 12, wherein the X of said octahalotrisilane $Si_3X_8$ is a halide selected from the group of F and Br.

14. The method in accordance with claim 12, wherein the octahalotrisilane $Si_3X_8$ silicon precursor is octachlorotrisilane (OCTS).

* * * * *